(12) United States Patent
Weizman et al.

(10) Patent No.: US 7,151,387 B2
(45) Date of Patent: Dec. 19, 2006

(54) ANALYSIS MODULE, INTEGRATED CIRCUIT, SYSTEM AND METHOD FOR TESTING AN INTEGRATED CIRCUIT

(75) Inventors: Yoav Weizman, Herzelia (IL); Shai Shperber, Herzelia (IL); Ezra Baruch, Heerzelia (IL)

(73) Assignee: Freescale Semiconductor, Inc., Austin, TX (US)

( * ) Notice: Subject to any disclaimer, the term of this patent is extended or adjusted under 35 U.S.C. 154(b) by 475 days.

(21) Appl. No.: 10/672,487

(22) Filed: Sep. 26, 2003

(65) Prior Publication Data

US 2004/0064772 A1 Apr. 1, 2004

(30) Foreign Application Priority Data

Oct. 1, 2002 (GB) ................ 0222691.8

(51) Int. Cl.
*G01R 31/02* (2006.01)
(52) U.S. Cl. ............ 324/763; 324/765; 324/73.1; 702/117
(58) Field of Classification Search ............ 324/158.1, 324/763, 765, 73.1; 438/14; 702/117
See application file for complete search history.

(56) References Cited

U.S. PATENT DOCUMENTS

| 4,243,937 | A | | 1/1981 | Multani |
| 4,970,454 | A | | 11/1990 | Stambaugh |
| 5,475,695 | A | * | 12/1995 | Caywood et al. ............ 714/738 |
| 5,570,035 | A | * | 10/1996 | Dukes et al. ................ 324/763 |
| 6,049,218 | A | | 4/2000 | Storino |
| 6,239,603 | B1 | | 5/2001 | Ukei |
| 6,556,938 | B1 | * | 4/2003 | Rohrbaugh et al. ......... 702/117 |
| 6,603,324 | B1 | * | 8/2003 | Eldridge et al. ............ 324/755 |
| 6,795,456 | B1 | * | 9/2004 | Scaggs ........................ 372/23 |

FOREIGN PATENT DOCUMENTS

JP 3235365 10/1991

* cited by examiner

*Primary Examiner*—Jermele Hollington
*Assistant Examiner*—Arleen M. Vazquez

(57) ABSTRACT

A system (5) for testing and failure analysis of an integrated circuit (10) is provided using failure analysis tools (40, 50, 60). An analysis module (30) having a number of submodule test structures is incorporated into the integrated circuit design. The test structures are chosen in dependence upon the failure analysis tools (40, 50, 60) to be used. The rest of the integrated circuit contains function modules (20) arranged to provide normal operating functions. By analysing the submodule test structures of the analysis module (30) using the failure analysis tools (40, 50, 60), physical parameters of the integrated circuit (10) are obtained and used in subsequent testing of the function modules (20) by the failure analysis tools (40, 50, 60), thus simplifying the testing of the integrated circuit (10) and reducing the time taken to perform a failure analysis procedure.

18 Claims, 6 Drawing Sheets

ANALYSIS MODULE, INTEGRATED CIRCUIT, SYSTEM AND METHOD FOR TESTING AN INTEGRATED CIRCUIT

FIELD OF THE INVENTION

This invention relates to testing and failure analysis of Very Large Semiconductor Integrated circuit (VLSI) devices and particularly but not exclusively to testing of devices using failure analysis tools.

BACKGROUND OF THE INVENTION

The testing and failure analysis of integrated semiconductor devices is well known and a number of Failure Analysis (FA) tools have been developed. For example it is known from U.S. Pat. No. 5,760,892 to provide a method of analyzing failure of a semiconductor device using an emission microscope.

It is also known from U.S. Pat. No. 6,153,891 to provide a method and apparatus providing a circuit edit structure through the backside of an integrated circuit die.

It is also known from U.S. Pat. No. 5,294,812 to provide a semiconductor device having an identification region which may be inspected by eye in order to discern information about the device.

Typically, such FA tools are used to measure and evaluate the performance of an integrated circuit are specified by physical signal parameters such as rise time, timing/jitter measurements, spatial visible resolution between diffusion/metals and crosstalk between adjacent phase-shifted signals. These parameters are measured and used to define performance criteria for the integrated circuit.

A known problem with such arrangements is that the abovementioned physical parameters are not readily isolated and identified from within the integrated circuitry. Particularly in the field of new and emerging process technologies and materials, calculations and derivations of the performance criteria must be made during the analysis itself, often in an iterative way, leading to a lengthy and complex procedure.

A need therefore exists for an analysis module, integrated circuit, system and method for testing an integrated circuit wherein the abovementioned disadvantage (s) may be alleviated.

STATEMENT OF INVENTION

In accordance with a first aspect of the present invention there is provided an analysis module as claimed in claim 1.

In accordance with a second aspect of the present invention there is provided an integrated circuit as claimed in claim 2.

In accordance with a third aspect of the present invention there is provided a system as claimed in claim 3.

Preferably the submodule test structure is chosen in dependence upon the analysis tool(s) to be used in subsequent testing.

In accordance with a fourth aspect of the present invention there is provided method for testing integrated circuit functionality as claimed in claim 5.

Preferably the submodule test structure(s) includes a calibration structure and/or a probing structure and/or optical alignment means.

The submodule test structure is preferably isolated from the function modules. Preferably the testing includes failure analysis.

In this way an analysis module, integrated circuit, system and method for testing an integrated circuit is provided in which rapid and inexpensive testing and failure analysis of an integrated circuit are facilitated.

BRIEF DESCRIPTION OF THE DRAWINGS

One analysis module, integrated circuit, system and method for testing an integrated circuit incorporating the present invention will now be described, by way of example only, with reference to the accompanying drawings, in which.

DESCRIPTION OF PREFERRED EMBODIMENT(S)

Failure Analysis (FA) instruments used for analysis of an Integrated Circuit (IC) die typically operate by taking measurements relating to the circuitry through the backside of the die. These measurements are then used to Locate the failure by measuring various physical aspects or parameters of the IC.

Figure 1:
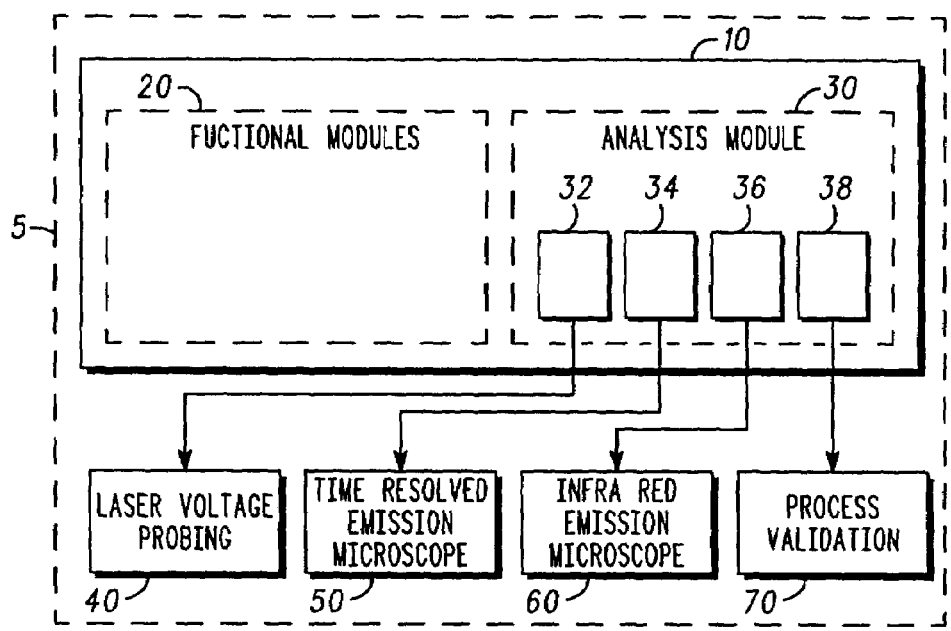
FIG. 1 shows a system for testing an integrated circuit in accordance with the invention.

Referring to FIG. 1, there is a system 5 shown for testing an Integrated Circuit (IC) 10 according to the present invention. The system incorporates a number of FA instruments: as a laser voltage probing system 40, a Time Resolved Emission Microscope (TRLEM) 50 and an Infrared Emission Microscope (IREM) 60. The system also incorporates electrical characterization equipment 70.

The IC 10 includes a first semiconductor area comprising function modules 20 and a second semiconductor area comprising an analysis module 30. The analysis module 30 includes four submodules 32, 34 36 and 38 respectively, to be further described below. The function modules 20 are those elements of the IC 10 which perform the normal operating functions of the IC 10.

As relatively little semiconductor material is required to implement the analysis module 30, areas of semiconductor material on the die not used for the operation modules 20 are utilised for the analysis module 30 and a change in die size is therefore not required in order to implement the present invention. It will be appreciated that the submodule test structures of the analysis module 30 need not occupy contiguous space on the integrated circuit 5.

The design of sub-modules 32, 34, 36 and 38 of the analysis module 30 are chosen according to the FA instruments 40, 50 and 60 and the electrical characterization equipment 70 to be used. In this way the appropriate test structures for the FA instruments 40, 50 and 60 respectively and for the electrical characterization equipment 70 are provided by the sub-modules 32, 34, 36 and 38 respectively, and the system performance evaluation and calibration may be readily performed in a manner to be further described below.

The laser voltage probing system 40 shown in FIG. 1 exploits InfraRed (IR) laser based techniques to allow signal waveforms and high frequency timing measurements to be derived directly from P-N junctions of a semiconductor structure through the silicon backside substrate in a flip-chip mounted IC packages.

Figure 2:
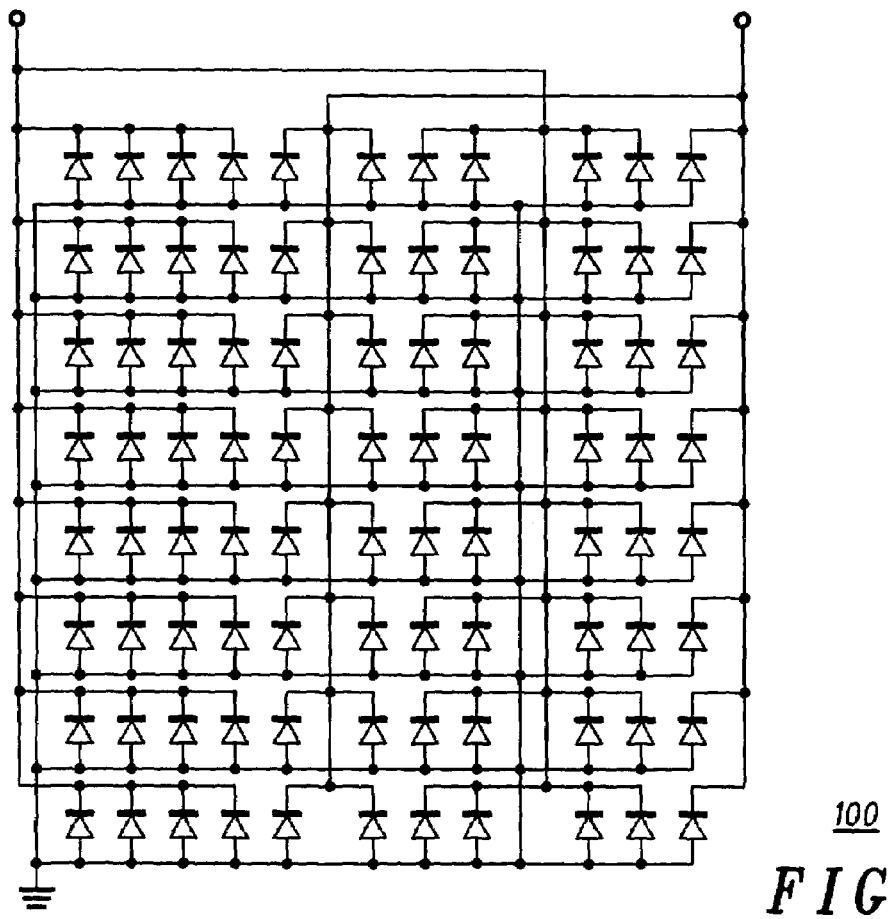
FIGS. 2, 5, 7, 8, 12, 13 and 14 show block schematic diagrams of different submodule test structures in accordance with different aspects of the present invention.
Figure 3:
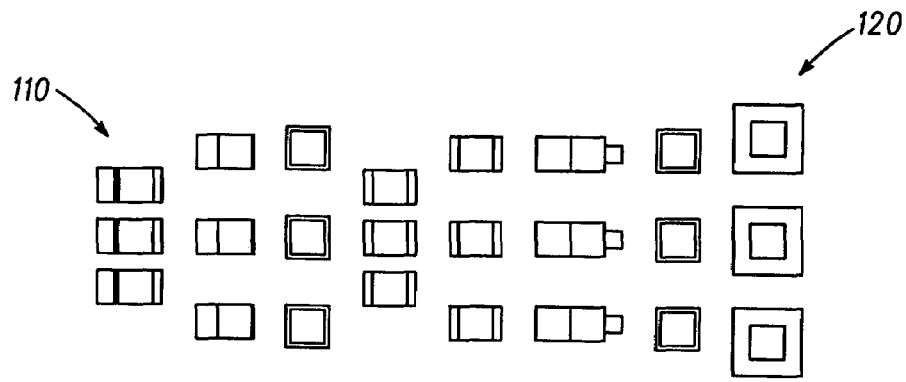
FIGS. 3 and 4 show topological diagrams of the test structures of FIG. 2.
Figure 4:
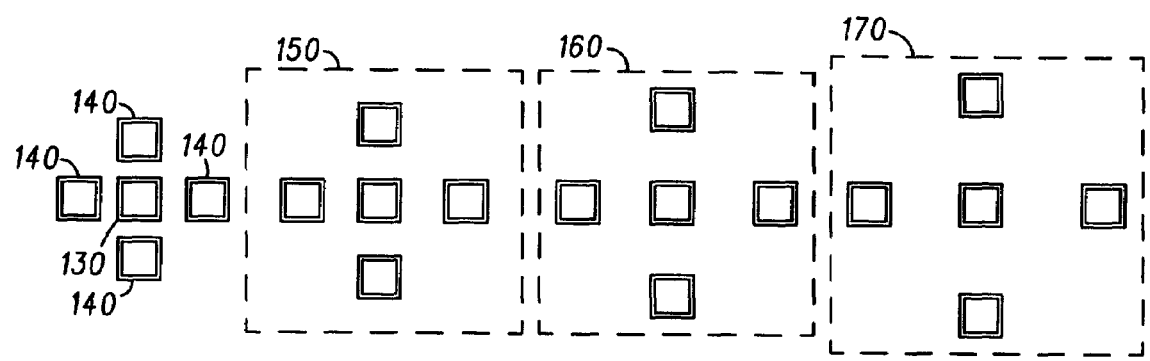

Referring now also to FIG. 2 there is shown a block schematic diagram of a circuit 100 having physical structures depicted in FIG. 3 and FIG. 4. The circuit 100 has a number of submodule structures to be used in conjunction with the laser system 40 in order to derive the following performance evaluation criteria:

a) Spatial visible resolution between two adjacent diffusions:

Referring now also to FIG. 3, which shows the physical topology of the circuit 100 of FIG. 2, diffusions are provided at various distances starting from a minimum distance 110 of approximately 0.18 um to a maximum distance 120 of 0.72 um.

b) Cross talk between adjacent phase shifted signals: Referring now also to FIG. 4, which shows the physical topology of the circuit 100 of FIG. 2, a leading diffusion 130 is surrounded with 4 diffusions 140 that carry a retarded signal. This structure is duplicated several times with different distances between the active areas, as shown by structures 150, 160 and 170 respectively.

Figure 5:
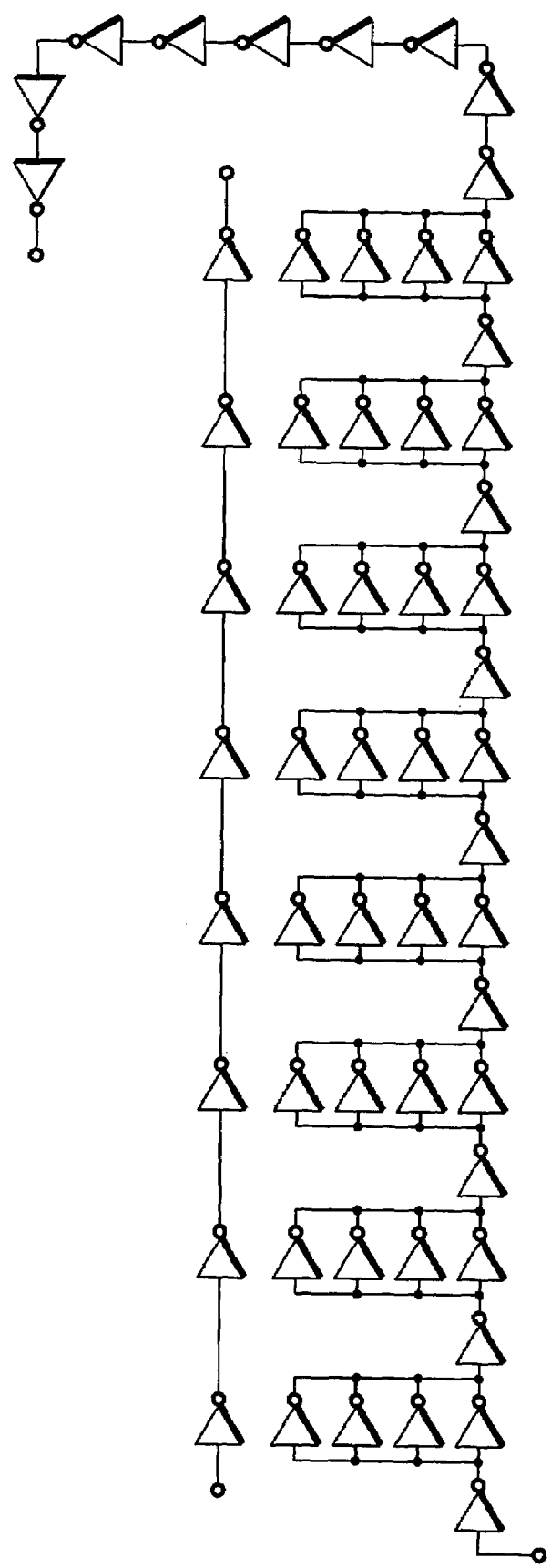
Figure 6:
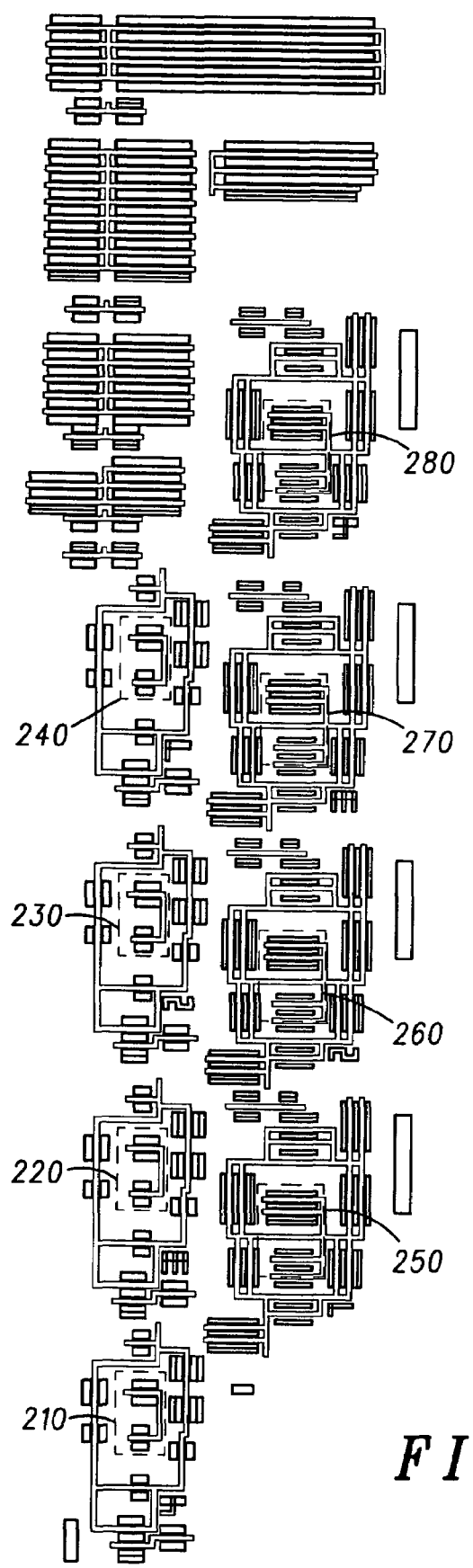
FIG. 6 shows a topological diagram of the structure of FIG. 5.

Referring now also to FIG. 5 there is shown an inverter chain circuit 200 used to generate the phase shifted signal. Alternatively the phase shifted signal may be provided by using different clock input. Cross talk may be measured in different frequencies and also with an asynchronous signal to create noise.

c) Sensitivity—Minimum measurable gate/diode area and voltages:

The diffusions shown in FIG. 3 provide structures of varying geometry and area.

d) Diodes Vs transistors:

Referring now also to FIG. 6, which shows the physical topology of the circuit 200 of FIG. 5, signals are sampled from diodes and from the inverters in the chain. FIG. 6 depicts structures having transistors of various gate area and loads.

e) P Vs N diodes:

The diode structure is duplicated as P type for comparison.

The TRLEM (Time Resolved Emission Microscope) 50 shown in FIG. 1 uses sensitive IR detector to acquire faint signals of switching transistors, to provide precise identification of defect location.

Normally biased CMOS logic circuits emit photons only in a short period during switching transients, allowing precise timing of individual transistors. The emitted light can be detected from the front or back side of an IC die. A high sensitivity detector can determine the exact timing of the photon emission. A detector array can also determine the location.

Figure 7:
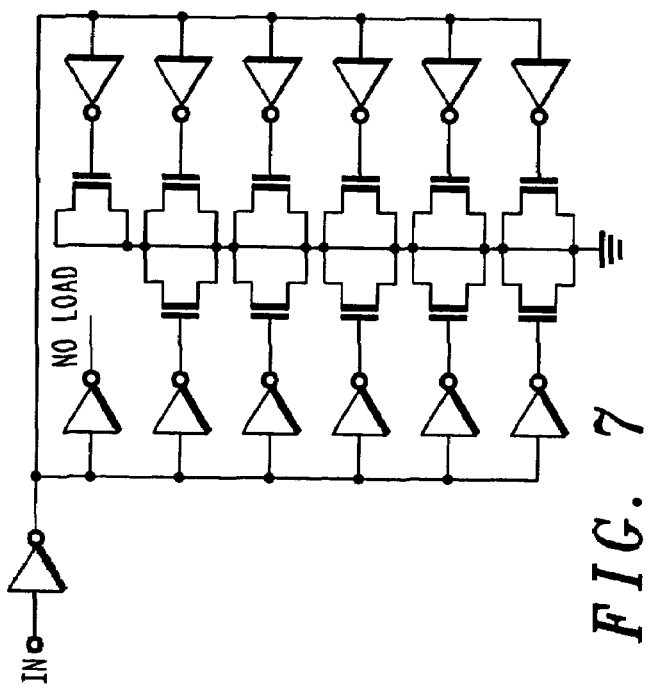
Figure 8:
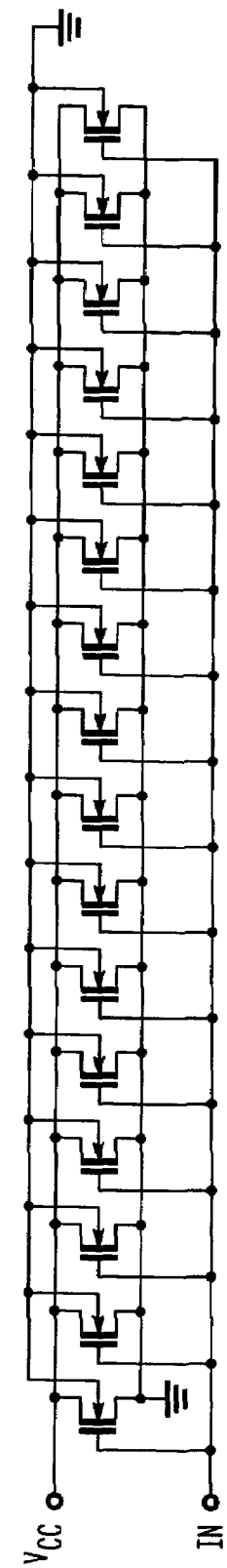

Referring now also to FIG. 8 there are shown a number of submodule structures to be used in conjunction with the TRLEM 50 in order to derive the following performance evaluation criteria:

a) Sensitivity—Minimum measurable gate area load and voltages:

Referring now also to FIG. 6, eight transistors of various gate area and loads are shown (transistors 210–280).

b) Spatial visible Resolution between two adjacent transistors:

Transistors are provided at various distances starting from a minimum distance of approximately 0.18 um to a maximum distance of approximately 1.44 um. (Transistors 210, 220, 230 and 240 of FIG. 6)

c) Cross talk between adjacent transistors carrying phase shifted signals:

leading inverter will be enveloped with 4 inverters that carry retarded signal. (Transistors 210, 220, 230 and 240 of FIG. 6) This structure will be present with four different distances between the active area and inverter sizes. (Transistors 250, 260, 270 and 280 of FIG. 6). The retarding signal will be generated from the inverter chain circuit 200 itself.

d) Load impact:

Load is especially influential on TRLEM measurements. Various inverters with various load capacitance will allow parametric analysis of load impact, as shown in FIG. 7.

e) P vs. N emissions:

These signals will be sampled (if resolution permits) from complementary transistors.

f) Measurements on NAND and NOR structures.

The IREM 60 shown in FIG. 1 utilises a cryogenically cooled HgCdTe (MCT) imaging focal plane array that have spectral response of 0.8–2.5 um. Several experiments show that photo-emission from a transistor in various emission states (forward bias, saturation, latch-up or gate oxide breakdown) extend beyond the 1.1 um into the near-IR. The IREM 60 is capable of detecting these emissions.

Figure 9:
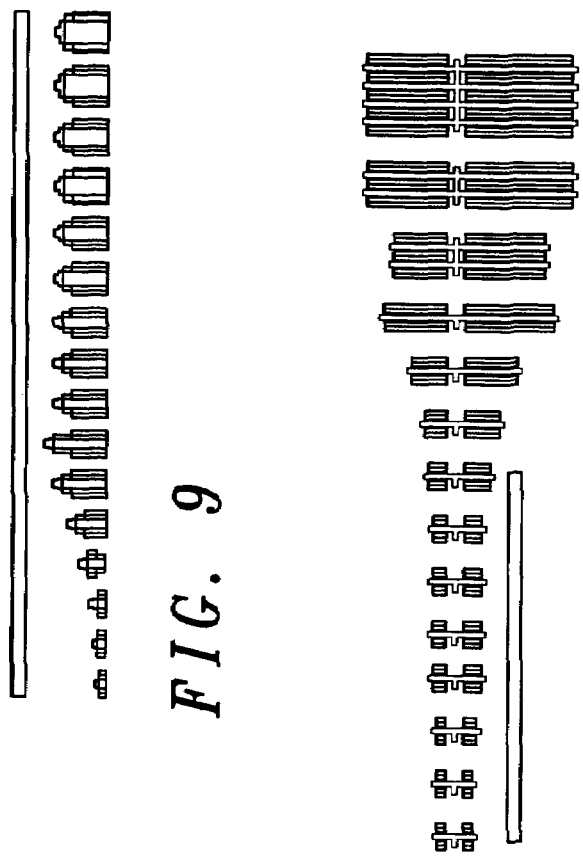
FIGS. 9, 10 and 11 show topological diagrams of the test structures of FIG. 8.
Figure 10:
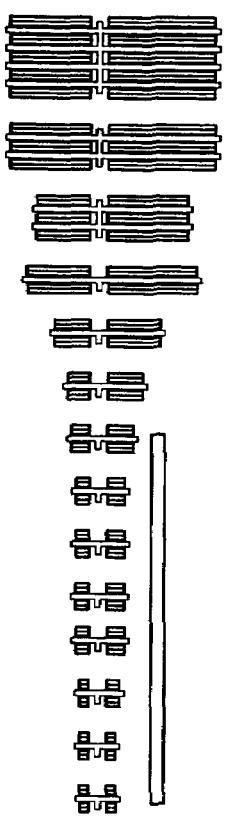

Referring now also to FIG. 8, there are shown a number of submodule structures to be used in conjunction with the IREM 60 in order to derive the following performance evaluation criteria:

a) Sensitivity, the minimum measurable emission Vs gate area:

Referring now also to FIG. 9, transistors of various gate width are provided, in order that a minimum detectable emission area may be evaluated.

b) Resolving power between two adjacent emission spots:

a set of identical transistors are placed at incremental distances.

c) Geometry and other physical parameters relation to emission:

Referring now also to FIG. 10, transistors with various width and lengths are provided.

d) Current and voltage dependence:

the gate and source of each transistor may be controlled independently of the gate level, as shown in FIG. 8.

e) Substrate current—substrate will be connected to separate supplies, as shown in FIG. 8.

Figure 11:
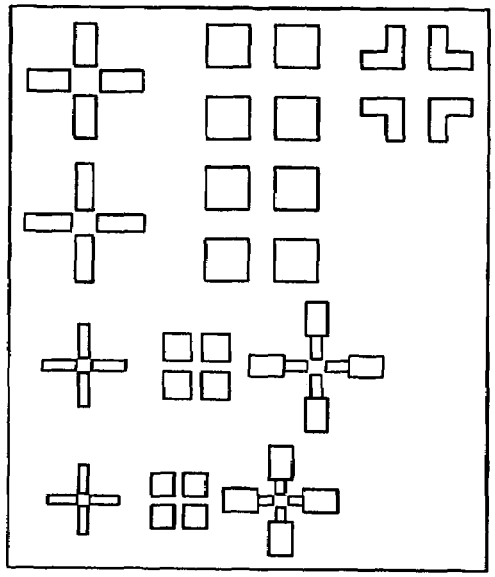

Referring now also to FIG. 11 there is shown a series of test structures forming an imaging block. The purpose of these structures is to evaluate the imaging capabilities for the different layers, from the backside, of the different FA tools. The imaging capabilities will be examined in x- and y-axes with lines spaced at various distances. It is also possible to examine the best fiducial characteristics for Computer Aided Design (CAD) navigation alignment with the various tools.

The submodule 38 of FIG. 1 is used in conjunction with the electrical characterization equipment 70 in order to characterize the AC parameters of the process.

As performance increases, and the performance margin of devices becomes critical, the electrical structures for AC characterization of process parameters serve as an indication and calibration point for other functional speed paths in the device. Comparison between the circuit simulation and the electrical structures performance provide the means to simulate functional speed paths with greater accuracy, and to investigate the degradation in AC performance of a device.

Figure 12:
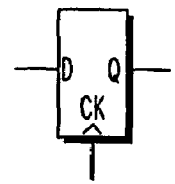
Figure 14:
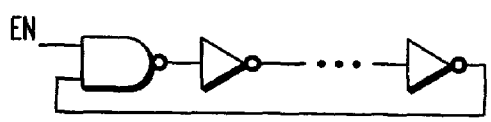
Figure 13:
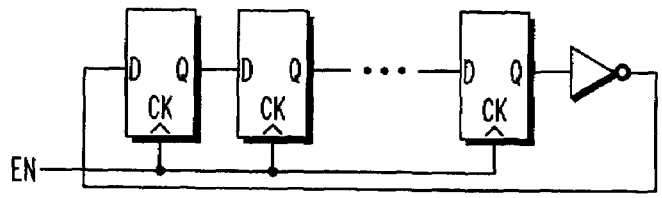

The structures for electrical characterization may include single components such as inverter, a latch, a Flip-Flop, or a Random Access Memory (RAM) bit cell. They may also include dedicated circuits such as a Ring oscillator or a part of functional speed path. Referring now to FIG. 12 there is shown a single latch. Referring now to FIG. 13 there is shown a ring oscillator comprising a number of latches as depicted in FIG. 12. Referring now to FIG. 14 there is shown a ring oscillator comprising a number of inverters.

Figure 15:
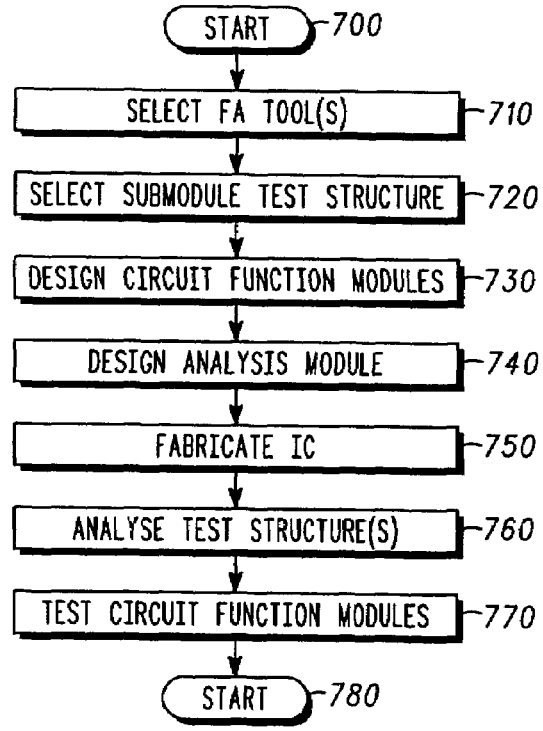
FIG. 15 shows an illustrative flow diagram of a process of fabricating and testing an IC in accordance with the present invention.

Referring now also to FIG. 15 there is shown an illustrative flow diagram of a process of fabricating and testing an IC such as the IC 10 of FIG. 1 in accordance with the present invention.

The process starts at block 700, and the first step (block 710) is to select the FA tool or tools which will be used to perform the testing and failure analysis. Then the submodule test structures appropriate for the selected FA tool(s) are selected (block 720). This may be performed, for example, by a library of submodule structures which are indexed according to FA tools.

The IC function modules are then mapped out on an IC design template (block 730) and unused areas of semiconductor material are identified. The analysis module, comprising the submodule test structures, is then mapped out on the IC design template (block 740), in these unused areas. The IC is then fabricated (block 750).

The testing and failure analysis of the IC is performed in two stages. In a first stage (block 760) the submodule test structures are analysed, in order to derive performance parameters. These are then used in a second stage (block 770) to test the function modules of the IC. This then ends the process (block 780).

It will be appreciated that various general layout considerations will be taken into account when designing and fabricating the IC.

The analysis module can be operated using as fewer as 3 bumps that will be dedicated for the special test structures: Designated Vcc (fa_vcc), and GND (fa_gnd), that would enable an independent supply source to the test structures, and an input signal. These bumps will be biased or toggled accordingly.

Furthermore the substrates of some of the test structures will be connected to the chip default GND (fa_chip_gnd) and VCC (chip_vcc) in order to allow substrate current monitoring. The GND will be connected by default. However the connection of chip Vcc is selectively performed by Focus Ion Beam (FIB) modification from the front side of the die.

All of the submodule test structure functionality may be initiated by last metal connections or cuts (i.e. front side FIB modifications or with fuses).

By default the ring oscillator is disabled and the IREM cells (FIGS. 8–10) are disabled when the TRLEM cells are tested and vice versa. This conditioning is done by gating fa_gnd and fa_in, when fa_gnd=1 IREM1 cells are disabled and when fa_gnd=0 TRLEM cells are disabled.

Last metal modifications will be carried out either by disconnecting a supply to a certain line or by connection between two adjacent metal 5 lines. It is necessary to keep a minimum distance between two lines with the intention of future connection. Lines that are intended to be disconnected should be as narrow as possible.

As described above, the submodule test structures may include probing arrangements (such as the TRLEM probe chain) and optical alignment arrangements used for checking system integrity and for CAD alignment.

Also by default the drain, source and gate electrodes of all submodule test structure transistors will be connected to ground. With FIB all Vcc's and GND's will be connected to the designated supplies and each of the transistors gated could be separately connected to the fa_in signal. The substrates of the P or N transistors will be connected to the regular Vcc or GND respectively.

It will be understood that the analysis module, integrated circuit, system and method for testing an integrated circuit described above provides the following advantages:

With the complexity of design (over 50 Mtransistors) and manufacturing process (<0.13 um, >5 metal layers and above all flip-chip) failure analysis is a critical step in the process development. With the present invention it is possible to readily isolate desired parameters for calibration and testing. In this way the boundaries of the specific process under examination may be determined at an early stage in the FA procedure, resulting in a significant time reduction without increasing the die size and without incurring any significant further cost.

It will be appreciated by a person skilled in the art that alternate embodiments to that described above are possible. For example, the present innovation is not limited to VLSI designs and may be incorporated into any new process design.

Furthermore the FA tools used for testing, and the number of FA tools used for any one IC may differ from those described above. Similarly the arrangements and number of associated submodule test structures may differ from those described above.

What is claimed:

1. A test structure for performance evaluation and/or calibration of a failure analysis instrument, the structure having circuit function modules, and an analysis module including at least one submodule test structure arranged such that analysis of the at least one submodule test structure by the failure analysis instrument provides at least one physical parameter of the structure for use in testing of the failure analysis instrument.

2. The test structure, of claim 1, wherein the at least one submodule test structure is chosen in dependence upon the at least one analysis tool to be used in subsequent testing.

3. The test structure of claim 1, wherein the at least one submodule test structure includes a calibration structure.

4. The test structure method of claim 1, wherein the at least one submodule test structure includes a probing structure.

5. The test structure of claim 1, wherein the at least one submodule test structure includes optical alignment means.

6. The test structure of claim 1, wherein the at least one submodule test structure is isolated from the function modules.

7. An integrated circuit for testing and/or calibrating a failure analysis instrument, the circuit comprising:
   circuit function modules arranged to provide operating functions of the integrated circuit; and,
   an analysis module including at least one submodule test structure arranged such that analysis of the at least one submodule test structure by the failure analysis instrument provides at least one physical parameter of the integrated circuit for use in subsequent testing of the failure analysis instrument.

8. The integrated circuit of claim 7, wherein the at least one submodule test structure is chosen in dependence upon the at least one analysis tool to be used in subsequent testing.

9. The integrated circuit of claim 7, wherein the at least one submodule test structure includes a calibration structure.

10. The integrated circuit of claim 7, wherein the at least one submodule test structure includes a probing structure.

11. The integrated circuit of claim 7, wherein the at least one submodule test structure includes optical alignment means.

12. The integrated circuit of claim 7, wherein the at least one submodule test structure is isolated from the function modules.

13. A system for performance evaluation and/or calibration of a failure analysis instrument, the system comprising:
at least one analysis tool;
an integrated circuit having circuit function modules arranged to provide operating functions of the integrated circuit, and an analysis module including at least one submodule test structure, wherein
the at least one submodule test structure is arranged such that analysis of the at least one submodule test structure by the at least one analysis tool provides at least one physical parameter of the integrated circuit for use in subsequent testing of the at least one analysis tool.

14. The system of claim 13, wherein the at least one submodule test structure is chosen in dependence upon the at least one analysis tool to be used in subsequent testing.

15. The system of claim 13, wherein the at least one submodule test structure includes a calibration structure.

16. The system of claim 13, wherein the at least one submodule test structure includes a probing structure.

17. The system of claim 13, wherein the at least one submodule test structure includes optical alignment means.

18. The system of claim 13, wherein the at least one submodule test structure is isolated from the function modules.

* * * * *